United States Patent
Chou et al.

(10) Patent No.: US 12,452,995 B2
(45) Date of Patent: Oct. 21, 2025

(54) ARRAYED RADIO-FREQUENCY (RF) SYSTEM

(71) Applicant: NATIONAL TAIWAN UNIVERSITY, Taipei (TW)

(72) Inventors: Hsi-Tseng Chou, Taipei (TW); Chih-Ta Yen, Taipei (TW); Qian-Xin An, Taipei (TW); Wei-Feng Chen, Taipei (TW); Cheng-Liang Shih, Taipei (TW)

(73) Assignee: National Taiwan University, Taipei (TW)

( * ) Notice: Subject to any disclaimer, the term of this patent is extended or adjusted under 35 U.S.C. 154(b) by 357 days.

(21) Appl. No.: 17/932,029

(22) Filed: Sep. 14, 2022

(65) Prior Publication Data

US 2024/0023229 A1 Jan. 18, 2024

(30) Foreign Application Priority Data

Jul. 14, 2022 (TW) ................................. 111126524

(51) Int. Cl.
*H05K 1/02* (2006.01)
*H01Q 1/12* (2006.01)
(Continued)

(52) U.S. Cl.
CPC .............. *H05K 1/0243* (2013.01); *H01Q 1/12* (2013.01); *H04B 1/40* (2013.01); *H05K 1/115* (2013.01); *H05K 2201/10098* (2013.01)

(58) Field of Classification Search
CPC .................. H05K 1/0243; H05K 1/115; H05K 2201/10098; H01Q 1/12; H04B 1/40
See application file for complete search history.

(56) References Cited

U.S. PATENT DOCUMENTS

2004/0027279 A1* 2/2004 Jacomb-Hood ........ H01Q 25/00
342/368
2004/0252059 A1* 12/2004 Zaghloul .............. H01Q 9/0414
343/700 MS
(Continued)

FOREIGN PATENT DOCUMENTS

CN       111541002 A      8/2020
TW       201440575 A     10/2014
(Continued)

OTHER PUBLICATIONS

Chen, Chun-Nien, et al. "38-GHz phased array transmitter and receiver based on scalable phased array modules with endfire antenna arrays for 5G MMW data links." IEEE Transactions on Microwave Theory and Techniques 69.1 (2020): 980-999.
(Continued)

*Primary Examiner* — John J Lee
(74) *Attorney, Agent, or Firm* — Rosenberg, Klein & Lee

(57) ABSTRACT

An arrayed RF system includes an expandable mother circuit carrier and sub-modules implemented with RF packaged radiation structures. The sub-modules are embedded onto the mother circuit carrier through plug-in interfaces to form a replaceable and expandable co-structural structure. The mother circuit carrier receives and up-converts an input intermediate-frequency signal, thereby generating first high-frequency signals. The sub-modules are horizontally embedded on the mother circuit carrier, arranged into a one-dimensional or two-dimensional array, and electrically connected to the mother circuit carrier. The RF packaged radiation structures respectively receive first high-frequency signals, thereby emitting first RF signals. The RF packaged radiation structures receive second RF signals, thereby generating second high-frequency signals. The mother circuit
(Continued)

carrier down-converts the second high-frequency signals, thereby generating an output intermediate-frequency signal.

11 Claims, 6 Drawing Sheets

(51) Int. Cl.
*H04B 1/40* (2015.01)
*H05K 1/11* (2006.01)

(56) References Cited

U.S. PATENT DOCUMENTS

2008/0204350 A1* 8/2008 Tam ............... H01Q 21/065
 343/872
2011/0109507 A1* 5/2011 Warnick ............ H01Q 21/0025
 342/368

FOREIGN PATENT DOCUMENTS

| | | |
|---|---|---|
| TW | 201448488 A | 12/2014 |
| TW | I508595 B | 11/2015 |
| TW | I665884 B | 7/2019 |
| TW | 202130038 A | 8/2021 |
| TW | I741695 B | 10/2021 |
| TW | I750635 B | 12/2021 |
| TW | 202211535 A | 3/2022 |
| TW | M627483 U | 5/2022 |
| WO | 2017015430 A1 | 1/2017 |

OTHER PUBLICATIONS

European Search Report mailed to Corresponding Foreign Patent Application No. 22199408.0-1206 on Aug. 17, 2023.
Office Action with appended Search Report issued to Taiwanese counterpart Application No. 111126524 on Jan. 16, 2023.

* cited by examiner

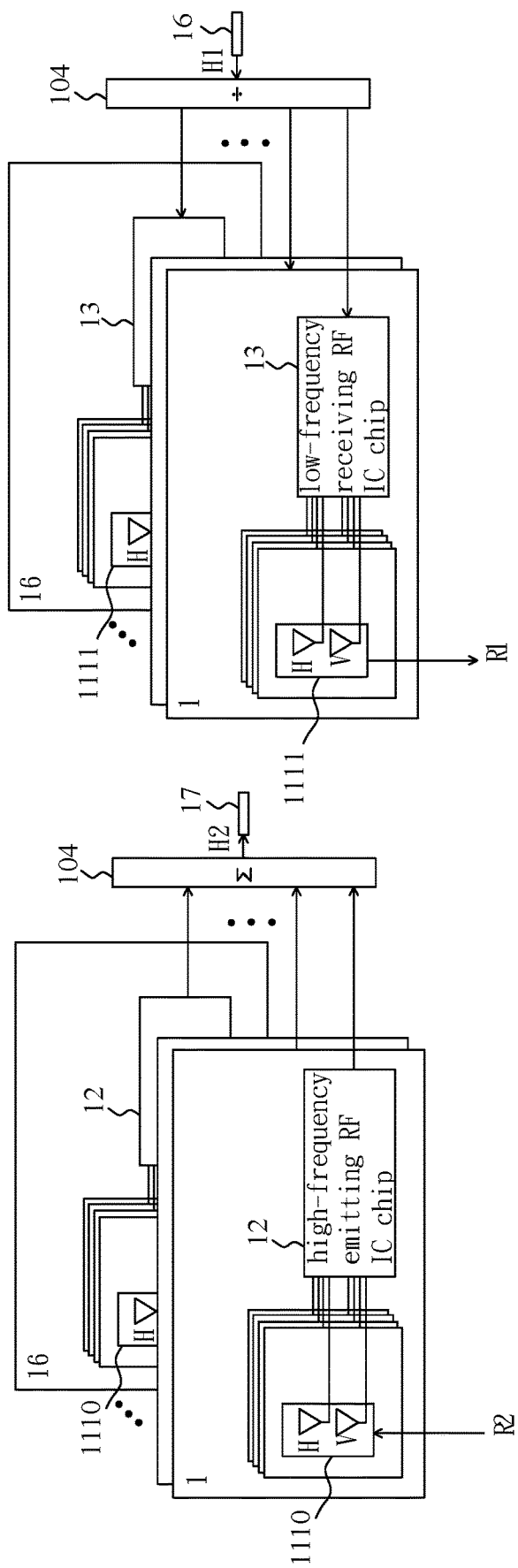

ARRAYED RADIO-FREQUENCY (RF) SYSTEM

This application claims priority of Application No. 111126524 filed in Taiwan on 14 Jul. 2022 under 35 U.S.C. § 119; the entire contents of all of which are hereby incorporated by reference.

BACKGROUND OF THE INVENTION

Field of the Invention

The present invention relates to a radio-frequency (RF) system, particularly to a detachable hierarchical arrayed radio-frequency (RF) system.

Description of the Related Art

Low/medium/high-orbit satellite ground terminals, 5G FR2 base stations, radar, and long-distance communications, point-to-point microwave links, fronthaul networks for communication systems and other industrial applications, with the characteristics of long-distance and different azimuth coverage, the construction of active array antennas realizes the dual function of this high gain, smart beam scanning operation. According to the diversity of planning application fields, the required antenna characteristics have to be quickly constructed with flexible configurations. It is difficult to customize products for a single situation to be simultaneously applicable to the situations of various fields.

The conventional technology integrates passive components including capacitors, resistors, and antennas, beam-forming chips including power amplifiers, phase shifters, and low-noise amplifiers, up-converting chips, down-converting chips, power chips, and microprocessors into a single unit system. For large-scale array antennas, the conventional all-in-one design technology will reduce the flexibility of the system configuration and increase the complexity and uncertainty of the problem. The maintenance cost is very high because the active antenna array system may suffer malfunctioning due to a few RF chips' failures. Because the cost and complexity of fabricating large-scale array antennas increase with the array's physical sizes, which is very expensive and cannot be cost-effective for mass production. In addition, the system has low expandability for a large array antenna. The large-scale array antennas cannot be flexibly constructed according to requirements for the different antenna gains of systems.

To overcome the abovementioned problems, the present invention provides a modular arrayed radio-frequency (RF) system, so as to solve the afore-mentioned problems of the prior art.

SUMMARY OF THE INVENTION

The present invention provides a modular arrayed radio-frequency (RF) system, which decomposes the system architecture into detachable modules. It simplifies system complexity, reduces fabrication cost and maintenance costs, and increases the stability of antenna characteristics and the application expansion of products. The modular arrayed RF system has a dielectric connection to form air cavities, increases airflow and heat dissipation, reduces the impact of thermal energy on the system, and takes mechanical and electronic characteristics into consideration.

In an embodiment of the present invention, an arrayed RF system includes a mother circuit carrier and sub-modules implemented with radio-frequency (RF) packaged radiation structures. The mother circuit carrier is configured to receive an input intermediate-frequency signal and up-convert the input intermediate-frequency signal to generate the first high-frequency signals. The sub-modules implemented with RF packaged radiation structures are horizontally embedded on the mother circuit carrier, arranged into a one-dimensional or two-dimensional array, and electrically (such as RF signals, power supply, and control signals) connected to the mother circuit carrier. The connection ports of the mother circuit carrier are periodically arranged. The connection port of the sub-modules is located at or close to the phase center point of the radiated electromagnetic field of the RF packaged radiation structure of the sub-module. The RF packaged radiation structures are divided into radio-frequency (RF) radiation modular groups. The RF radiation modular groups of the RF packaged radiation structures are respectively configured to receive the first high-frequency signals and emit the first radio-frequency (RF) signals in response to the first high-frequency signals. The RF radiation modular groups of the RF packaged radiation structures are respectively configured to receive second radio-frequency (RF) signals and generate second high-frequency signals in response to the second RF signals. The second high-frequency signals respectively correspond to the RF radiation modular groups. The mother circuit carrier is configured to down-convert the second high-frequency signals to generate an output intermediate-frequency signal.

In an embodiment of the present invention, the mother circuit carrier includes a dielectric board, an intermediate-frequency input port, a first power divider, upconverters, and second power dividers. The dielectric board is provided with connection ports. The sub-modules implemented with RF packaged radiation structures are embedded on the connection ports of the dielectric board. The intermediate-frequency input port is arranged on the dielectric board. The first power divider is arranged on the dielectric board and electrically connected to the intermediate-frequency input port. The first power divider is configured to receive the input intermediate-frequency signal through the intermediate-frequency input port, and divide the power of the input intermediate-frequency signal according to the number of output terminals of the first power divider, thereby generating the first intermediate-frequency signals at the output terminals of the first power divider. The output terminals are connected to the input ports of the sub-modules implemented with RF packaged radiation structures and periodically arranged into a one-dimensional or two-dimensional array. The upconverters are arranged on the dielectric board and respectively electrically connected to the output terminals of the first power divider. The upconverters are configured to receive the first intermediate-frequency signals and up-convert the first intermediate-frequency signals to generate up-converting signals. The second power dividers are arranged on the dielectric board and respectively electrically connected to the upconverters and the RF radiation modular groups of the RF packaged radiation structures. Each of the second power dividers is configured to receive the corresponding up-converting signal, and divide the corresponding up-converting signal according to the number of output terminals of the second power divider, thereby generating the first high-frequency signals.

In an embodiment of the present invention, the mother circuit carrier further includes third power dividers, down-converters, a fourth power divider, and an intermediate-frequency output port. The third power dividers are arranged on the dielectric board and respectively electrically connected to the RF radiation modular groups of the RF packaged radiation structures. Each of the third power dividers is configured to receive and sum the power of the corresponding second high-frequency signals to generate a summing high-frequency signal. The down-converters are arranged on the dielectric board and respectively electrically connected to the third power dividers. The down-converters are configured to receive the corresponding summing high-frequency signals and down-convert the corresponding summing high-frequency signals to generate second intermediate-frequency signals. The fourth power divider is arranged on the dielectric board and electrically connected to the downconverters. The fourth power divider is configured to receive the second intermediate-frequency signals and sum the power of the second intermediate-frequency signals to generate the output intermediate-frequency signal. The intermediate-frequency output port is arranged on the dielectric board and electrically connected to the fourth power divider. The intermediate-frequency output port is configured to output the output intermediate-frequency signal.

In an embodiment of the present invention, the mother circuit carrier further includes first signal connection ports and second signal connection ports. The first signal connection ports are arranged on the dielectric board and divided into the first groups. The first groups are respectively electrically connected to the second power dividers and the RF radiation modular groups. Each of the first groups is electrically connected between the corresponding second power divider and the corresponding RF radiation modular groups. The second signal connection ports are arranged on the dielectric board and divided into second groups. The second groups are respectively electrically connected to the third power dividers and the RF radiation modular groups. Each of the second groups is electrically connected between the corresponding third power divider and the corresponding RF radiation modular groups.

In an embodiment of the present invention, the first signal connection ports and the second signal connection ports are sub-miniature push-on micro (SMPM) ports.

In an embodiment of the present invention, the mother circuit carrier further includes the first power-supplying ports and the second power-supplying ports on the dielectric board.

In an embodiment of the present invention, the first power-supplying ports and the second power-supplying ports are serial peripheral interface (SPI) buses or signal control circuits.

In an embodiment of the present invention, each of the RF packaged radiation structures includes a multilayer conductive wiring substrate, radio-frequency (RF) radiation structures, high-frequency emitting radio-frequency (RF) integrated circuit (IC) chips, low-frequency receiving radio-frequency (RF) integrated circuit (IC) chips, an emitting signal connection port, and a receiving signal connection port. The multilayer conductive wiring substrate includes dielectric layers, conductive traces, first conductive vias, and second conductive vias. The conductive traces are electrically connected to the first conductive vias and the second conductive vias. The radio-frequency (RF) radiation structures are arranged on the bottom surface of the multilayer conductive wiring substrate and embedded on the multilayer conductive wiring substrate. The high-frequency emitting RF IC chips and the low-frequency receiving RF IC chips are arranged on the top surface of the multilayer conductive wiring substrate. The high-frequency emitting RF IC chips are electrically connected to first conductive vias through first conductive structures, thereby respectively electrically connecting to the RF radiation structures. The low-frequency receiving RF IC chips are electrically connected to second conductive vias through second conductive structures, thereby respectively electrically connecting to the RF radiation structures. The emitting signal connection port and the receiving signal connection port are arranged on the top surface of the multilayer conductive wiring substrate and electrically connected to the mother circuit carrier. The emitting signal connection port is electrically connected to the high-frequency emitting RF IC chips through the conductive traces and the first conductive structures. The receiving signal connection port is electrically connected to the low-frequency receiving RF IC chips through the conductive traces and the second conductive structures. The multilayer conductive wiring substrate and the high-frequency emitting RF IC chips are configured to receive the first high-frequency signal, thereby emitting the first RF signals through the RF radiation structures. The multilayer conductive wiring substrate and the low-frequency receiving RF IC chips are configured to receive the second RF signals through the RF radiation structures, thereby generating the second high-frequency signal.

In an embodiment of the present invention, each of the RF radiation structures further includes a first power connection port and a second power connection port. The first power connection port and the second power connection port are arranged on the top surface of the multilayer conductive wiring substrate and electrically connected to the mother circuit carrier. The first power connection port is electrically connected to the high-frequency emitting RF IC chips through the first conductive vias and the first conductive structures. The second power connection port is electrically connected to the low-frequency receiving RF IC chips through the second conductive vias and the second conductive structures.

In an embodiment of the present invention, each of the RF radiation structures includes a first antenna layer and a second antenna layer. The first antenna layer is arranged on the bottom surface of the multilayer conductive wiring substrate. The second antenna layer is embedded between two of the dielectric layers closest to the bottom surface of the multilayer conductive wiring substrate and electrically connected to the first conductive vias and the second conductive vias.

In an embodiment of the present invention, the first antenna layer includes four first emitting antenna blocks and four first receiving antenna blocks. The second antenna layer includes four second emitting antenna blocks and four second receiving antenna blocks. The first emitting antenna blocks are respectively directly located under the second emitting antenna blocks. The first receiving antenna blocks are respectively directly located under the second receiving antenna blocks. The second emitting antenna blocks are electrically connected to the corresponding first conductive structures and the corresponding high-frequency emitting RF IC chip through the first conductive vias. The second receiving antenna blocks are electrically connected to the corresponding second conductive structures and the corresponding low-frequency receiving RF IC chip through the second conductive vias. The first emitting antenna blocks and the second emitting antenna blocks are configured to emit the first RF signal. The first receiving antenna blocks and the second receiving antenna blocks are configured to receive the second RF signal.

To sum up, just like the same chassis used in mainstream automobiles, the arrayed RF system horizontally embeds the RF packaged radiation structures into the mother circuit carrier, so as to simplify system complexity, reduce fabrication cost, and increase the stability of antenna characteristics and the application expansion of products. The arrayed RF system has a reconfigurable architecture for different application scenarios and generates different RF powers. When the arrayed RF system has an abnormal problem, a part of the RF packaged radiation structures can be replaced in order to quickly detect the malfunction and avoid damage to the entire RF system caused by the failure of one module, thereby reducing the maintenance cost. The RF packaged radiation structure is a module composed of an RF structure and antennas. The mother circuit carrier is mainly used to perform system functions, such as transmitting signals, supplying power, and up-converting or down-converting RF signals. As a result, the RF packaged radiation structure, which is a co-structural structure composed of an RF structure and antennas, emphasizes modularization, the convenience of mass production, and replacement for maintenance. The mother circuit carrier emphasizes the expandability of the system, including the size of the array antenna, the expansion of the operating voltage, the series and parallel connection of signal transmission, and the implementation of the heat dissipation mechanism. The arrayed RF system employs a common interface to improve the commonality of the system. The interface between the RF packaged radiation structure and the mother circuit carrier forms an air channel to conduct heat dissipation, so as to reduce the system impact of thermal energy and take mechanical and electronic characteristics into consideration.

Below, the embodiments are described in detail in cooperation with the drawings to make easily understand the technical contents, characteristics, and accomplishments of the present invention.

BRIEF DESCRIPTION OF THE DRAWINGS

FIG. 5 and FIG. 6 are diagrams schematically illustrating the circuits corresponding to an RF packaged radiation structure according to an embodiment of the present invention.

DETAILED DESCRIPTION OF THE INVENTION

Figure 1:
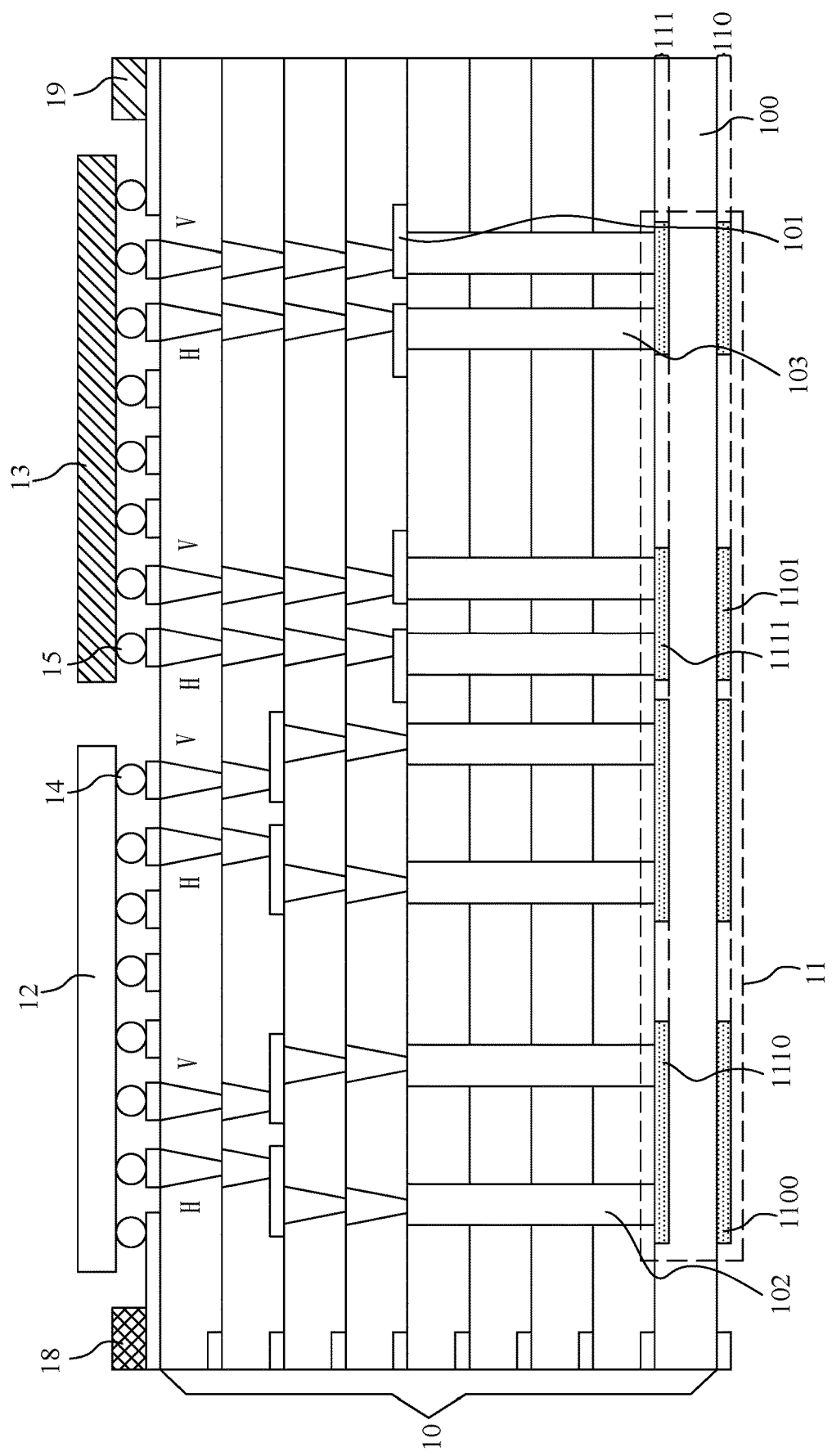
FIG. 1 is a cross-sectional view of a part of a radio-frequency (RF) packaged radiation structure according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the specific components, structures and features in one or more embodiments may be combined in a suitable manner.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

A radio-frequency (RF) packaged radiation structure will be provided as follows. The RF packaged radiation structure employs a multilayer conductive wiring substrate to construct a plurality of input/output (I/O) ports. Different frequency bands and different polarization directions respectively correspond to different I/O ports. Different I/O ports are respectively connected to different antenna blocks for independent operation and used to reduce reliance on duplexers and circulators. In addition, emitting antenna blocks and receiving antenna blocks are alternately arranged and physically isolated to improve isolation and reduce the generation of cross-polarization. The RF packaged radiation structure can perform dual-band and dual-polarization operations to meet the requirements of low-orbit satellite uplink and downlink and 5G FR2 dual-band. Antenna characteristics required for high gain and intelligent scanning when the array antenna is constructed.

Figure 2:
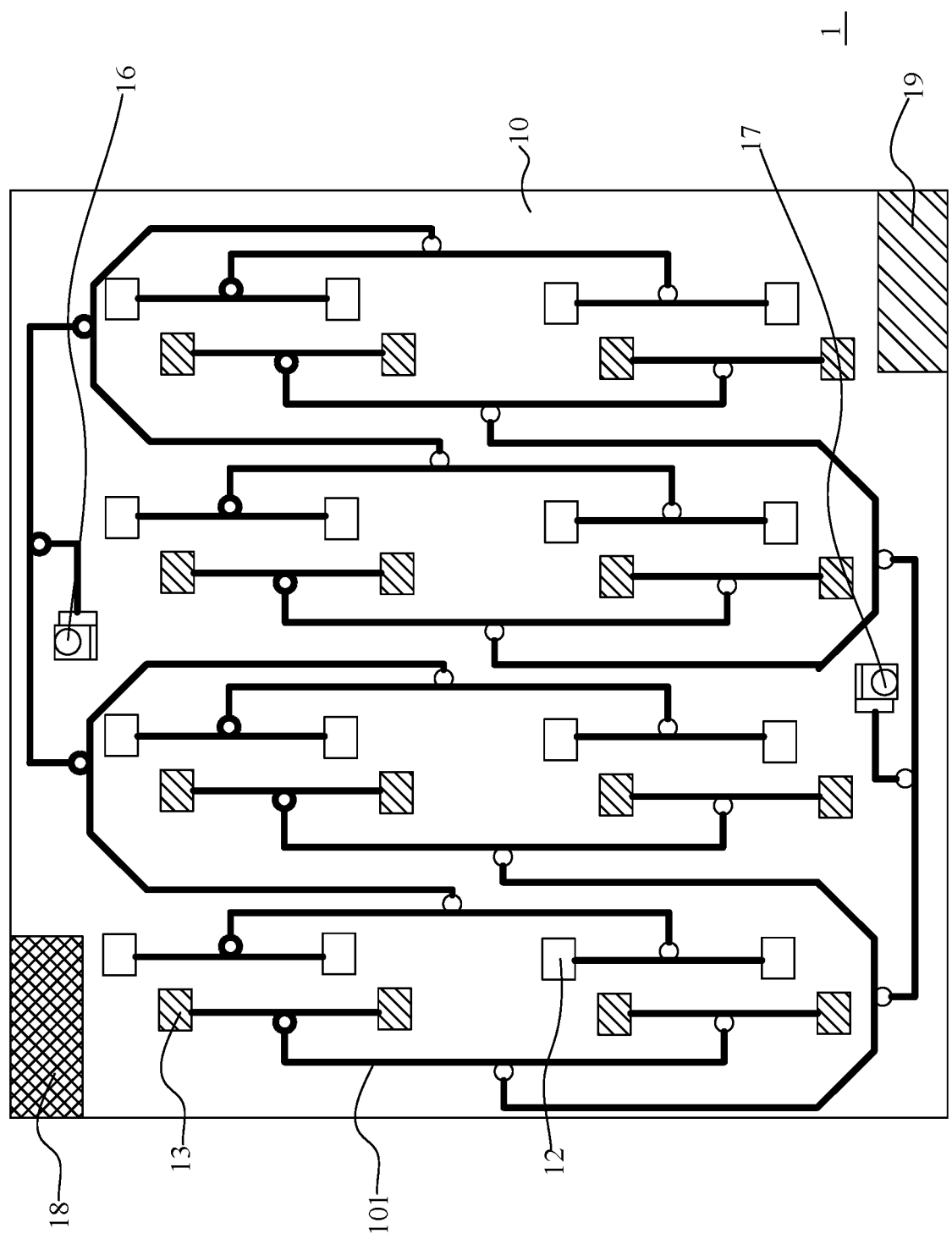
FIG. 2 is a top view of an RF packaged radiation structure according to an embodiment of the present invention.
Figure 3:
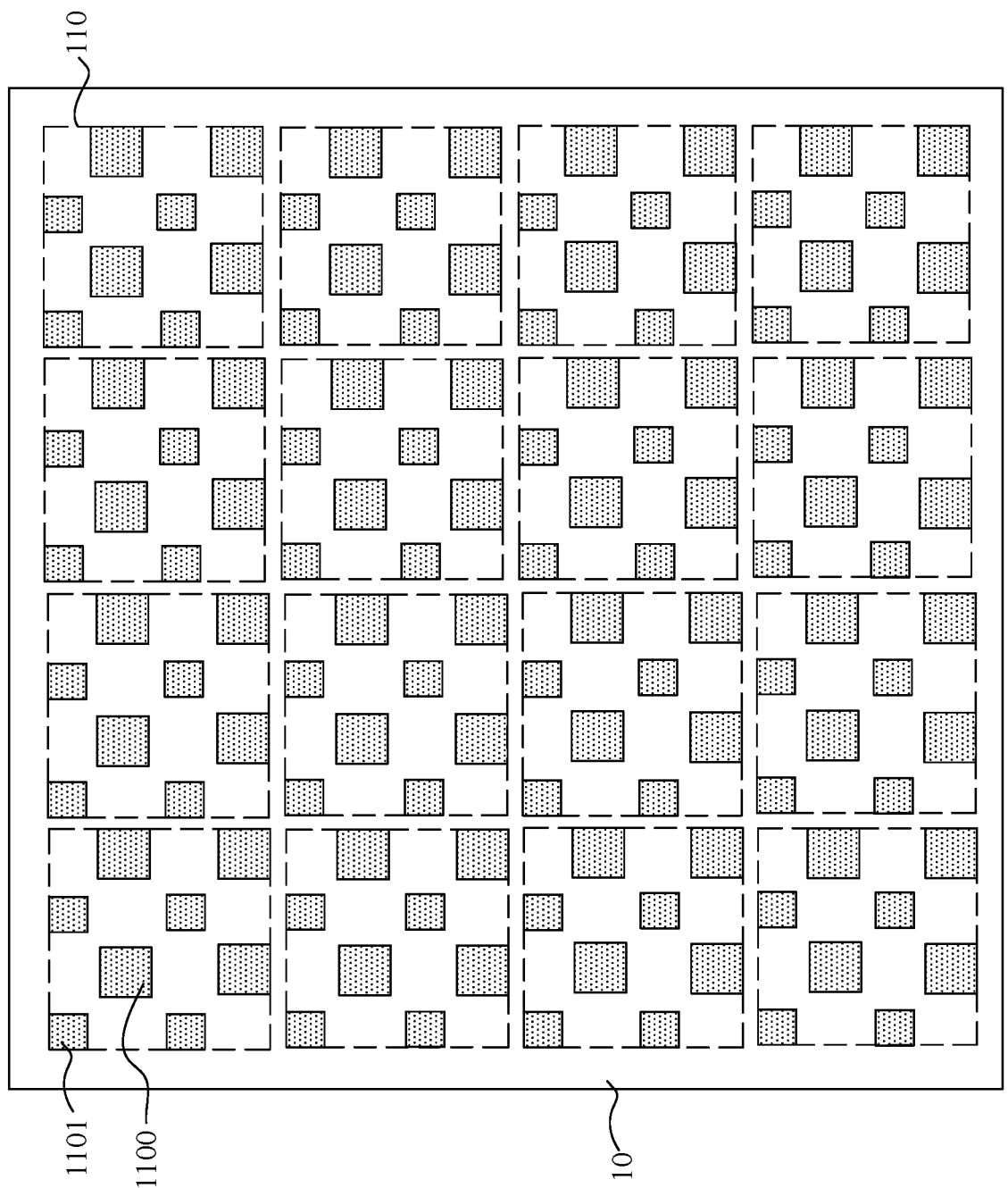
FIG. 3 is a bottom view of an RF packaged radiation structure according to an embodiment of the present invention.

FIG. 1 is a cross-sectional view of a part of a radio-frequency (RF) packaged radiation structure according to an embodiment of the present invention. FIG. 2 is a top view of an RF packaged radiation structure according to an embodiment of the present invention. FIG. 3 is a bottom view of an RF packaged radiation structure according to an embodiment of the present invention. Referring to FIG. 1, FIG. 2, and FIG. 3, an embodiment of an RF packaged radiation structure 1 is introduced as follows. The RF packaged radiation structure 1 includes a multilayer conductive wiring substrate 10, radio-frequency (RF) radiation structures 11, high-frequency emitting radio-frequency (RF) integrated circuit (IC) chips 12, low-frequency receiving radio-frequency (RF) integrated circuit (IC) chips 13, first conductive structures 14, and second conductive structures 15. The first conductive structures 14 and the second conductive structures 15 may be, but not limited to, conductive solder balls. The multilayer conductive wiring substrate 10 includes dielectric layers 100, conductive traces 101, first conductive vias 102, and second conductive vias 103. The conductive traces 101 are electrically connected to the first conductive vias 102 and the second conductive vias 103. The radio-frequency (RF) radiation structures 11 are arranged on the bottom surface of the multilayer conductive wiring substrate 10 and embedded on the multilayer conductive wiring substrate 10. The high-frequency emitting RF IC chips 12 and the low-frequency receiving RF IC chips 13 are arranged on the top surface of the multilayer conductive wiring substrate 10. The high-frequency emitting RF IC chips 12 are electrically connected to first conductive vias 102 through the first conductive structures 14, thereby respectively electrically connecting to the RF radiation structures 11. The low-frequency receiving RF IC chips 13 are electrically connected to second conductive vias 103 through the second conductive structures 15, thereby respectively electrically connecting to the RF radiation structures 11.

In some embodiments of the present invention, each of the RF radiation structures 11 may include a first antenna layer 110 and a second antenna layer 111. The first antenna layer 110 is arranged on the bottom surface of the multilayer conductive wiring substrate 10. The second antenna layer 111 is embedded between two of the dielectric layers 100 closest to the bottom surface of the multilayer conductive wiring substrate 10 and electrically connected to the first conductive vias 102 and the second conductive vias 103.

Specifically, the first antenna layer 110 may include four first emitting antenna blocks 1100 and four first receiving antenna blocks 1101. The second antenna layer 111 may include four second emitting antenna blocks 1110 and four second receiving antenna blocks 1111. The first emitting antenna blocks 1100, the first receiving antenna blocks 1101, the second emitting antenna blocks 1110, and the second receiving antenna blocks 1111 may be, but not limited to, rectangles. The first emitting antenna blocks 1100 are respectively directly located under the second emitting antenna blocks 1110. The first receiving antenna blocks 1101 are respectively directly located under the second receiving antenna blocks 1111. The second emitting antenna blocks 1110 are electrically connected to the corresponding first conductive structures 14 and the corresponding high-frequency emitting RF IC chip 12 through the first conductive vias 102. The second receiving antenna blocks 1111 are electrically connected to the corresponding second conductive structures 15 and the corresponding low-frequency receiving RF IC chip 13 through the second conductive vias 103. For example, the first conductive vias 102 corresponding to one high-frequency emitting RF IC chip 12 may be divided into four groups. Each group of the first conductive vias 102 further includes two sets of sub-vias for respectively transmitting a high-frequency horizontal polarization signal H and a high-frequency vertical polarization signal V. Each group of the first conductive vias 102 is electrically connected to one second emitting antenna block 1110. The second conductive vias 103 corresponding to one low-frequency receiving RF IC chip 13 may be divided into four groups. Each group of the second conductive vias 103 further includes two sets of sub-vias for respectively transmitting a low-frequency horizontal polarization signal H and a low-frequency vertical polarization signal V. Each group of the second conductive vias 103 is electrically connected to one second receiving antenna block 1111. Each set of sub-vias is viewed as an independent I/O port for independent operation and used to reduce reliance on duplexers and circulators.

The first emitting antenna blocks 1100 of the RF radiation structures 11 are arranged into a first square array. The first receiving antenna blocks 1101 of the RF radiation structures 11 are arranged into a second square array. The columns of the first square array and the second square array are alternately arranged. The rows of the first square array and the second square array are alternately arranged. As a result, the first square array and the second square array are alternately arranged and physically isolated to improve isolation and reduce the generation of cross-polarization.

The top surface of the multilayer conductive wiring substrate 10 may be provided with an emitting signal connection port 16 and a receiving signal connection port 17. The emitting signal connection port 16 and the receiving signal connection port 17 may be, but not limited to, sub-miniature push-on micro (SMPM) ports. The emitting signal connection port 16 is electrically connected to the high-frequency emitting RF IC chips 12 through the conductive traces 101 and the first conductive structures 14. The receiving signal connection port 17 is electrically connected to the low-frequency receiving RF IC chips 13 through the conductive traces 101 and the second conductive structures 15. The top surface of the multilayer conductive wiring substrate 10 is further provided with a first power connection port 18 and a second power connection port 19. The first power connection port 18 and the second power connection port may be, but not limited to, serial peripheral interface buses. The first power connection port 18 is electrically connected to the high-frequency emitting RF IC chips 12 through the first conductive vias 102 and the first conductive structures 14. The second power connection port 19 is electrically connected to the low-frequency receiving RF IC chips 13 through the second conductive vias 103 and the second conductive structures 15.

An arrayed RF system will be provided as follows. The arrayed RF system horizontally embeds the RF packaged radiation structures into a mother circuit carrier, so as to simplify system complexity, reduce fabrication cost, and increase the stability of antenna characteristics and the application expansion of products. The arrayed RF system has reconfigurable architecture for different application scenarios and generates different RF powers. When the arrayed RF system has an abnormal problem, a part of the RF packaged radiation structures can be replaced in order to quickly detect the malfunction and avoid the damage of the entire RF system caused by the failure of one module, thereby reducing the maintenance cost. The RF packaged radiation structure is a module composed of an RF structure and antennas. The mother circuit carrier is mainly used to perform system functions, such as transmitting signals, supplying power, and up-converting or down-converting RF signals. As a result, the RF packaged radiation structure, which is a co-structural structure composed of an RF structure and antennas, emphasizes modularization, the convenience of mass production, and replacement for maintenance. The mother circuit carrier emphasizes the expandability of the system including the size of the array antenna, the expansion of the operating voltage, the series and parallel connection of signal transmission, and the implementation of heat dissipation mechanism. The arrayed RF system employs a common interface to improve the commonality of the system. The interface between the RF packaged radiation structure and the mother circuit carrier forms an air channel to conduct heat dissipation, so as to reduce the system impact of thermal energy, and take mechanical and electronic characteristics into consideration.

Figure 4:
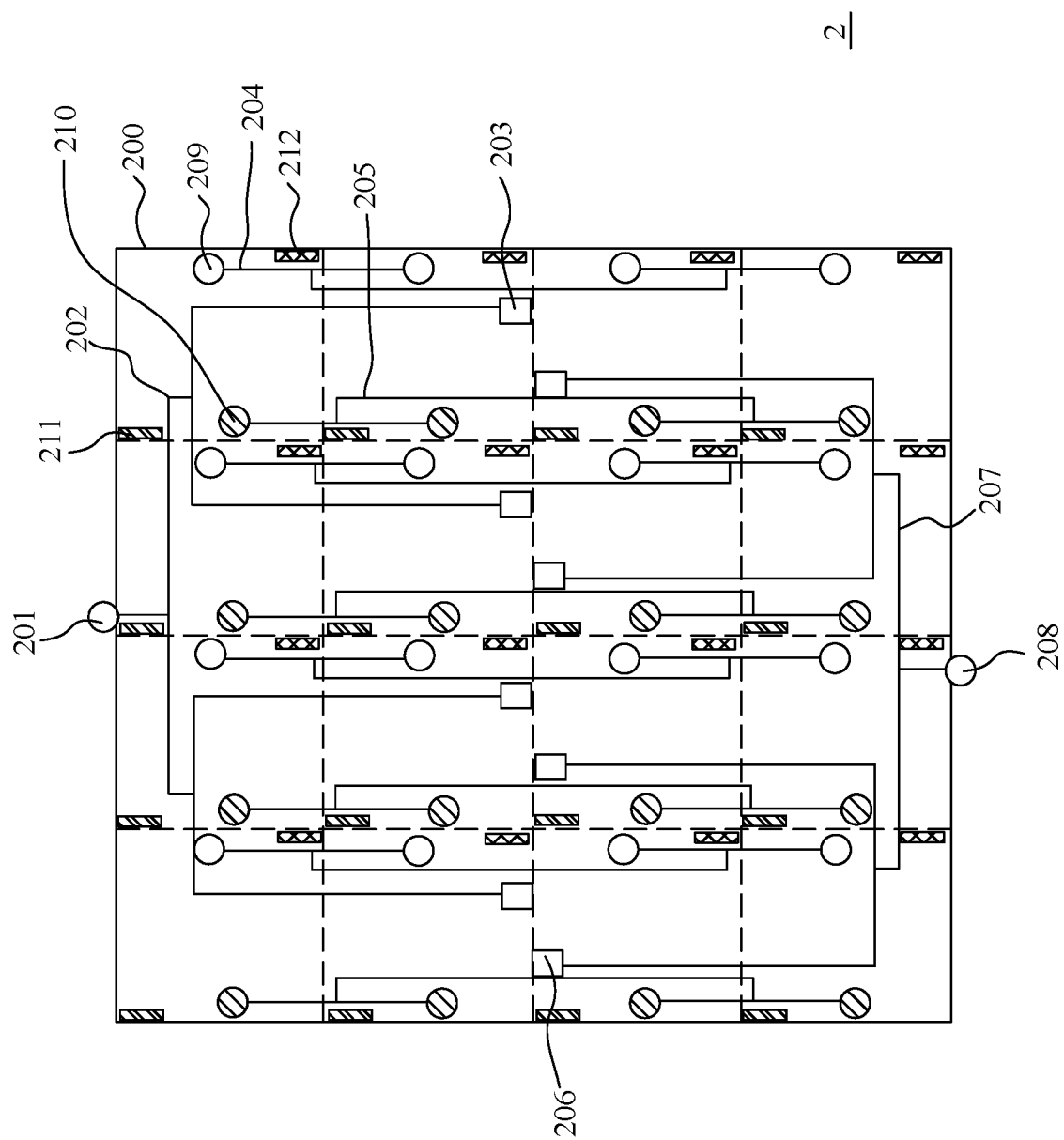
FIG. 4 is a top view of a mother circuit carrier according to an embodiment of the present invention.

FIG. 4 is a top view of a mother circuit carrier according to an embodiment of the present invention. Referring to FIG. 4 and FIG. 2, an embodiment of the arrayed RF system is introduced as follows. The arrayed RF system includes a mother circuit carrier 2 and RF packaged radiation structures 1. The RF packaged radiation structures 1 are horizontally embedded on the mother circuit carrier, arranged into an array, and electrically connected to the mother circuit carrier 2. The RF packaged radiation structures 1 are divided into radio-frequency (RF) radiation modular groups. Take FIG. 4 as an example. The RF packaged radiation structures 1 are arranged into a 4×4 array. Each RF radiation modular group corresponds to a particular column of the array, and includes the four RF packaged radiation structures 1 in said column of the array.

Figure 8:
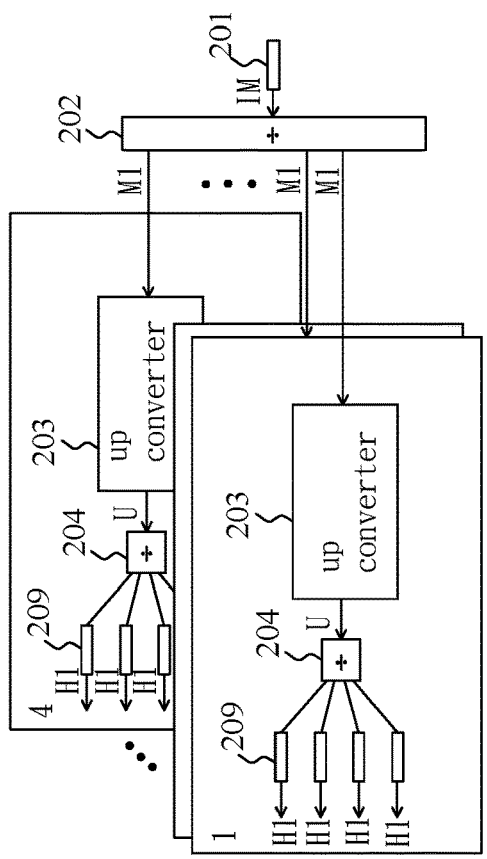
FIG. 7 and FIG. 8 are diagrams schematically illustrating the circuits corresponding to a mother circuit carrier according to an embodiment of the present invention.
Figure 7:
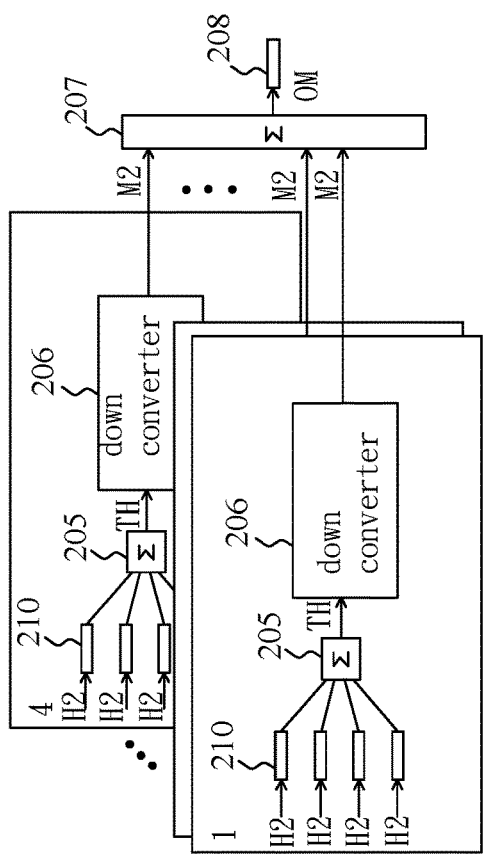

FIG. 5 and FIG. 6 are diagrams schematically illustrating the circuits corresponding to an RF packaged radiation structure according to an embodiment of the present invention. FIG. 7 and FIG. 8 are diagrams schematically illustrating the circuits corresponding to a mother circuit carrier according to an embodiment of the present invention. Refer to FIG. 2, FIG. 4, FIG. 5, FIG. 6, FIG. 7, and FIG. 8. In operation, the mother circuit carrier 2 receives an input intermediate-frequency signal IM and up-converts the input intermediate-frequency signal IM to generate first high-frequency signals H1. The multilayer conductive wiring substrate 10 of each RF packaged radiation structure 1 is provided with power dividers 104. The power divider 104 is configured to divide or sum the power of the high-frequency signals. The RF radiation modular groups of the RF packaged radiation structures 1 respectively receive the first high-frequency signals H1 and emit first radio-frequency (RF) signals R1 in response to the first high-frequency signals H1. The RF radiation modular groups of the RF packaged radiation structures 1 respectively receive second radio-frequency (RF) signals R2 and generate second high-frequency signals H2 in response to the second RF signals R2. The second high-frequency signals H2 respectively correspond to the RF radiation modular groups. The mother circuit carrier 2 down-converts the second high-frequency signals H2 to generate an output intermediate-frequency signal OM.

In some embodiments of the present invention, the mother circuit carrier 2 includes a dielectric board 200, an intermediate-frequency input port 201, a first power divider 202, upconverters 203, second power dividers 204, third power dividers 205, downconverters 206, a fourth power divider 207, an intermediate-frequency output port 208, first signal connection ports 209, second signal connection ports 210, first power-supplying ports 211, and second power-supplying ports 212. The first signal connection ports 209 and the second signal connection ports 210 may be, but not limited to, sub-miniature push-on micro (SMPM) ports. The intermediate-frequency input port 201 and the intermediate-frequency output port 208 may be, but not limited to, sub-miniature-A (SMA) ports.

The dielectric board 200 is provided with the RF packaged radiation structures 1, the intermediate-frequency input port 201, the first power divider 202, the upconverters 203, the second power dividers 204, the third power dividers 205, the downconverters 206, the fourth power divider 207, the intermediate-frequency output port 208, the first signal connection ports 209, the second signal connection ports 210, the first power-supplying ports 211, and the second power-supplying ports 212. The first power divider 202 is electrically connected to the intermediate-frequency input port 201. The upconverters 203 are respectively electrically connected to the output terminals of the first power divider 202. The second power dividers 204 are respectively electrically connected to the upconverters 203 and the RF radiation modular groups of the RF packaged radiation structures 1. The third power dividers 205 are respectively electrically connected to the RF radiation modular groups of the RF packaged radiation structures 1. The downconverters 206 are respectively electrically connected to the third power dividers 205. The fourth power divider 207 is electrically connected to the downconverters 206. The intermediate-frequency output port 208 is electrically connected to the fourth power divider 207.

The first power divider 202 receives the input intermediate-frequency signal IM through the intermediate-frequency input port 201, and divides the power of the input intermediate-frequency signal IM according to the number of the output terminals of the first power divider 202, thereby generating first intermediate-frequency signals M1 at the output terminals of the first power divider 202. The upconverters 203 receive the first intermediate-frequency signals M1 and up-converts the first intermediate-frequency signals M1 to generate up-converting signals U. Each of the second power dividers 204 receives the corresponding up-converting signal U, and divides the corresponding up-converting signal U according to the number of the output terminals of the second power divider 204, thereby generating the first high-frequency signals H1.

Each of the third power dividers 205 receives and sums the power of the corresponding second high-frequency signals H2 to generate a summing high-frequency signal TH. The downconverters 206 receive the corresponding summing high-frequency signals TH and down-convert the corresponding summing high-frequency signals TH to generate second intermediate-frequency signals M2. The fourth power divider 207 receives the second intermediate-frequency signals M2 and sums the power of the second intermediate-frequency signals M2 to generate the output intermediate-frequency signal OM. The intermediate-frequency output port 208 is configured to output the output intermediate-frequency signal OM.

The first signal connection ports 209 are divided into first groups. The first groups are respectively electrically connected to the second power dividers 204 and respectively electrically connected to the emitting signal connection ports 16 of the RF radiation modular groups. Each of the first groups is electrically connected between the corresponding second power divider 204 and the emitting signal connection ports 16 of the corresponding RF radiation modular group. The second signal connection ports 210 are divided into second groups. The second groups are respectively electrically connected to the third power dividers 205 and respectively electrically connected to the receiving signal connection ports 17 of the RF radiation modular groups. Each of the second groups is electrically connected between the corresponding third power divider 205 and the receiving signal connection ports 17 of the corresponding RF radiation modular group. In addition, the first power-supplying ports 211 are respectively electrically connected to the first power-supplying ports 18 of the RF packaged radiation structures 1. The second power-supplying ports 212 are respectively electrically connected to the second power-supplying ports 19 of the RF packaged radiation structures 1.

The RF packaged radiation structures 1 horizontally are embedded onto the mother circuit carrier 2, so as to simplify system complexity, reduce fabrication cost, and increase the stability of antenna characteristics and the application expansion of products. The arrayed RF system has reconfigurable architecture for different application scenarios and generates different RF powers. When the arrayed RF system has an abnormal problem, a part of the RF packaged radiation structures can be replaced in order to quickly detect the malfunction and avoid the damage of the entire RF system caused by the failure of one module, thereby reducing the maintenance cost. The interface between the RF packaged radiation structure 1 and the mother circuit carrier 2 forms an air channel to conduct heat dissipation, so as to reduce the system impact of thermal energy, and take mechanical and electronic characteristics into consideration.

Referring to FIG. 1, FIG. 5, and FIG. 6, the power divider 104 of the multilayer conductive wiring substrate 10 and the high-frequency emitting RF IC chips 12 receive the first high-frequency signal H1, thereby emitting the first RF signals R1 through the RF radiation structures 11. The power divider 104 of the multilayer conductive wiring substrate 10 and the low-frequency receiving RF IC chips 13 receive the second RF signals R2 through the RF radiation structures 11, thereby generating the second high-frequency signal H2. The first emitting antenna blocks 1100 and the second emitting antenna blocks 1110 are configured to emit the first RF signal R1. The first receiving antenna blocks 1101 and the second receiving antenna blocks 1111 are configured to receive the second RF signal R2.

According to the embodiments provided above, the arrayed RF system simplifies system complexity, reduces fabrication cost and maintenance cost, increases the stability of antenna characteristics and the application expansion of products, reduces the system impact of thermal energy, and takes mechanical and electronic characteristics into consideration.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An arrayed radio-frequency (RF) system comprising:
a mother circuit carrier configured to receive an input intermediate-frequency signal and up-convert the input intermediate-frequency signal to generate first high-frequency signals; and
a plurality of radio-frequency (RF) packaged radiation structures horizontally embedded on the mother circuit carrier, arranged into an array, and electrically connected to the mother circuit carrier, the plurality of RF packaged radiation structures being grouped into a plurality of radio-frequency (RF) radiation modular groups, each RF radiation modular group comprising a subset of the plurality of RF packaged radiation structures aligned in a corresponding column of the array,
wherein the plurality of RF radiation modular groups are respectively configured to:
receive the first high-frequency signals and emit first radio-frequency (RF) signals in response to the first high-frequency signals, and
receive second radio-frequency (RF) signals and generate second high-frequency signals in response to the second RF signals, the second high-frequency signals respectively corresponding to the RF radiation modular groups, and
wherein the mother circuit carrier is configured to down-convert the second high-frequency signals to generate an output intermediate-frequency signal.

2. The arrayed RF system according to claim 1, wherein the mother circuit carrier comprises:
a dielectric board on which the plurality of RF packaged radiation structures are disposed;
an intermediate-frequency input port arranged on the dielectric board;
a first power divider arranged on the dielectric board and electrically connected to the intermediate-frequency input port, wherein the first power divider is configured to receive the input intermediate-frequency signal through the intermediate-frequency input port, and divide power of the input intermediate-frequency signal according to number of output terminals of the first power divider, thereby generating first intermediate-frequency signals at the output terminals of the first power divider;
upconverters arranged on the dielectric board and respectively electrically connected to the output terminals of the first power divider, wherein the upconverters are configured to receive the first intermediate-frequency signals and up-convert the first intermediate-frequency signals to generate up-converting signals; and second power dividers arranged on the dielectric board and respectively electrically connected to the upconverters and the RF radiation modular groups of the RF packaged radiation structures, wherein each of the second power dividers is configured to receive the corresponding up-converting signal, and divide the corresponding up-converting signal according to number of output terminals of the second power divider, thereby generating the first high-frequency signals.

3. The arrayed RF system according to claim 2, wherein the mother circuit carrier further comprises:

third power dividers arranged on the dielectric board and respectively electrically connected to the RF radiation modular groups of the RF packaged radiation structures, wherein each of the third power dividers is configured to receive and sum power of the corresponding second high-frequency signals to generate a summing high-frequency signal;

downconverters arranged on the dielectric board and respectively electrically connected to the third power dividers, wherein the downconverters are configured to receive the corresponding summing high-frequency signals and down-convert the corresponding summing high-frequency signals to generate second intermediate-frequency signals;

a fourth power divider arranged on the dielectric board and electrically connected to the downconverters, wherein the fourth power divider is configured to receive the second intermediate-frequency signals and sum power of the second intermediate-frequency signals to generate the output intermediate-frequency signal; and an intermediate-frequency output port arranged on the dielectric board and electrically connected to the fourth power divider, wherein the intermediate-frequency output port is configured to output the output intermediate-frequency signal.

4. The arrayed RF system according to claim 3, wherein the mother circuit carrier further comprises:

first signal connection ports arranged on the dielectric board and divided into first groups, the first groups are respectively electrically connected to the second power dividers and the RF radiation modular groups, and each of the first groups is electrically connected between the corresponding second power divider and the corresponding RF radiation modular groups; and second signal connection ports arranged on the dielectric board and divided into second groups, the second groups are respectively electrically connected to the third power dividers and the RF radiation modular groups, and each of the second groups is electrically connected between the corresponding third power divider and the corresponding RF radiation modular groups.

5. The arrayed RF system according to claim 4, wherein the first signal connection ports and the second signal connection ports are sub-miniature push-on micro (SMPM) ports.

6. The arrayed RF system according to claim 4, wherein the mother circuit carrier further comprises first power-supplying ports and second power-supplying ports on the dielectric board.

7. The arrayed RF system according to claim 6, wherein the first power-supplying ports and the second power-supplying ports are serial peripheral interface (SPI) buses.

8. The arrayed RF system according to claim 1, wherein each of the RF packaged radiation structures comprises:

a multilayer conductive wiring substrate comprising dielectric layers, conductive traces, first conductive vias, and second conductive vias, wherein the conductive traces are electrically connected to the first conductive vias and the second conductive vias;

radio-frequency (RF) radiation structures arranged on a bottom surface of the multilayer conductive wiring substrate and embedded on the multilayer conductive wiring substrate;

high-frequency emitting radio-frequency (RF) integrated circuit (IC) chips and low-frequency receiving radio-frequency (RF) integrated circuit (IC) chips, arranged on a top surface of the multilayer conductive wiring substrate, wherein the high-frequency emitting RF IC chips are electrically connected to first conductive vias through first conductive structures, thereby respectively electrically connecting to the RF radiation structures, and the low-frequency receiving RF IC chips are electrically connected to second conductive vias through second conductive structures, thereby respectively electrically connecting to the RF radiation structures; and an emitting signal connection port and a receiving signal connection port, arranged on the top surface of the multilayer conductive wiring substrate and electrically connected to the mother circuit carrier, wherein the emitting signal connection port is electrically connected to the high-frequency emitting RF IC chips through the conductive traces and the first conductive structures, and the receiving signal connection port is electrically connected to the low-frequency receiving RF IC chips through the conductive traces and the second conductive structures;

wherein the multilayer conductive wiring substrate and the high-frequency emitting RF IC chips are configured to receive the first high-frequency signal, thereby emitting the first RF signals through the RF radiation structures;

wherein the multilayer conductive wiring substrate and the low-frequency receiving RF IC chips are configured to receive the second RF signals through the RF radiation structures, thereby generating the second high-frequency signal.

9. The arrayed RF system according to claim 8, wherein each of the RF radiation structures further comprises a first power connection port and a second power connection port, the first power connection port and the second power connection port are arranged on the top surface of the multilayer conductive wiring substrate and electrically connected to the mother circuit carrier, the first power connection port is electrically connected to the high-frequency emitting RF IC chips through the first conductive vias and the first conductive structures, and the second power connection port is electrically connected to the low-frequency receiving RF IC chips through the second conductive vias and the second conductive structures.

10. The arrayed RF system according to claim 8, wherein each of the RF radiation structures comprises:

a first antenna layer arranged on the bottom surface of the multilayer conductive wiring substrate; and a second antenna layer embedded between two of the dielectric layers closest to the bottom surface of the multilayer conductive wiring substrate and electrically connected to the first conductive vias and the second conductive vias.

11. The arrayed RF system according to claim 10, wherein the first antenna layer comprises four first emitting antenna blocks and four first receiving antenna blocks, the second antenna layer comprises four second emitting antenna blocks and four second receiving antenna blocks, the first emitting antenna blocks are respectively directly located under the second emitting antenna blocks, the first receiving antenna blocks are respectively directly located under the second receiving antenna blocks, the second emitting antenna blocks are electrically connected to the corresponding first conductive structures and the corresponding high-frequency emitting RF IC chip through the first conductive vias, the second receiving antenna blocks are electrically connected to the corresponding second conductive structures and the corresponding low-frequency receiving RF IC chip through the second conductive vias, the first emitting antenna blocks and the second emitting antenna blocks are configured to emit the first RF signal, and the first receiving antenna blocks and the second receiving antenna blocks are configured to receive the second RF signal.

\* \* \* \* \*